(12) United States Patent
Syu et al.

(10) Patent No.: US 12,550,278 B2
(45) Date of Patent: Feb. 10, 2026

(54) DETACHING MECHANISM FOR A DETACHABLE MODULE AND ELECTRONIC DEVICE THEREWITH

(71) Applicant: Wistron Corporation, New Taipei (TW)

(72) Inventors: Yi-Sing Syu, New Taipei (TW); Chi-Ken Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 430 days.

(21) Appl. No.: 18/085,592

(22) Filed: Dec. 21, 2022

(65) Prior Publication Data
US 2024/0040730 A1    Feb. 1, 2024

(30) Foreign Application Priority Data

Jul. 28, 2022   (TW) .................................. 111128320

(51) Int. Cl.
*H05K 7/14*   (2006.01)

(52) U.S. Cl.
CPC ......... *H05K 7/1404* (2013.01); *H05K 7/1414* (2013.01); *H05K 7/1418* (2013.01); *H05K 7/1485* (2013.01)

(58) Field of Classification Search
CPC .. H05K 7/1404; H05K 7/1414; H05K 7/1418; H05K 7/1485; H05K 7/1415; H05K 7/18; H05K 5/0221; H05K 7/1489; H05K 7/1409; H05K 7/1488; H05K 7/14
See application file for complete search history.

(56) References Cited

U.S. PATENT DOCUMENTS 7,987,584 B2 *   8/2011   Barna .................. H05K 7/1415
                                                29/259

FOREIGN PATENT DOCUMENTS

TW           201331935 A1      8/2013

* cited by examiner

Primary Examiner — James Wu
Assistant Examiner — Dakota M Talbert
(74) Attorney, Agent, or Firm — Winston Hsu

(57) ABSTRACT

A detaching mechanism for a detachable module is provided. The detaching mechanism includes an engaging component and a driving component. The engaging component is for separately engaging with a positioning component. The engaging component is movable relatively to the detachable module along a first direction. The driving component is movable relatively to the detachable module along a second direction different from the first direction. When the driving component moves along the second direction, the driving component pushes the engaging component to move along the first direction, so as to drive the engaging component to disengage from the positioning component. An electronic device with the aforementioned detaching mechanism is also provided.

20 Claims, 10 Drawing Sheets

DETACHING MECHANISM FOR A DETACHABLE MODULE AND ELECTRONIC DEVICE THEREWITH

BACKGROUND OF THE INVENTION

1. Field of the Invention

The present invention relates to a detaching mechanism and an electronic device therewith, and more specifically, to a detaching mechanism for a detachable module and an electronic device therewith.

2. Description of the Prior Art

In order to satisfy different requirements in different application fields, modularity has gradually become a mainstream trend of electronic devices. A conventional modular electronic device usually utilizes a fastener, such as a screw component, to assemble and position a detachable module, such as a hard disk drive backplane module. However, such mechanism is not convenient to use. For example, when it is desired to detach the detachable module, a user has to use an additional tool, such as a screw driver, to detach the fastener. Furthermore, during a detachment process, the fastener may be dropped accidently due to a careless operation. When the fastener is dropped, it takes extra time for the user to find and pick up the dropped fastening component, which causes a delay of the detachment process.

SUMMARY OF THE INVENTION

Therefore, it is an objective of the present invention to provide a detaching mechanism for a detachable module and an electronic device therewith for solving the aforementioned problems.

In order to achieve the aforementioned objective, the present invention discloses a detaching mechanism for a detachable module. The detaching mechanism includes an engaging component and a driving component. The engaging component separately engages with a positioning component. The engaging component is movable relatively to the detachable module along a first direction. The driving component is movable relatively to the detachable module along a second direction different from the first direction. When the driving component moves along the second direction, the driving component moves the engaging component along the first direction, and the engaging component disengages from the positioning component.

According to an embodiment of the present invention, the detaching mechanism further includes an accommodating frame. The detachable module and the engaging component are disposed on the accommodating frame. The engaging component is movable along the first direction, and the driving component is disposed on the accommodating frame and movable along the second direction.

According to an embodiment of the present invention, a sliding portion is formed on the accommodating frame. A sliding slot is formed on the engaging component, and the sliding portion is disposed through the sliding slot and slidable relatively to the sliding slot along the first direction.

According to an embodiment of the present invention, a first through hole is formed on the sliding portion. An end of the driving component is disposed through the first through hole, and the driving component is movable relatively to the first through hole along the second direction.

According to an embodiment of the present invention, a protruding lug is further formed on the accommodating frame. The protruding lug is located correspondingly to the sliding portion. A second through hole is formed on the protruding lug. The second through hole is aligned with the first through hole along the second direction. Another end of the driving portion is disposed through the second through hole, and the driving component is movable relatively to the second through hole along the second direction.

According to an embodiment of the present invention, the detaching mechanism further includes a recovering component disposed between the accommodating frame and the engaging component.

According to an embodiment of the present invention, the detaching mechanism further includes an elastic component disposed between the accommodating frame and the driving component.

According to an embodiment of the present invention, a plurality of abutting portions are formed on the accommodating frame. The engaging component is clamped between the plurality of abutting portions, and a plurality of avoiding notches are formed on the engaging component.

According to an embodiment of the present invention, a restraining portion is formed on the accommodating frame. The restraining portion abuts against the detachable module.

According to an embodiment of the present invention, a positioning portion is formed on the positioning component. An engaging portion is formed on the engaging component. When the engaging component moves along the first direction, the engaging portion departs away from the positioning portion, and the engaging component disengages from the positioning component.

According to an embodiment of the present invention, the driving component includes a pushing portion. The engaging component includes a pushed portion. A longitudinal direction of the pushed portion is different from the first direction and the second direction. When the driving component moves along the second direction, the driving component pushes the engaging component to move along the first direction by a cooperation of the pushing portion and the pushed portion.

In order to achieve the aforementioned objective, the present invention further discloses an electronic device. The electronic device includes a main body, a positioning component, a detachable module and a detaching mechanism. The positioning component is fixedly disposed on the main body. The detachable module is detachably installed on the main body. The detaching mechanism installs the detachable module on the main body or detaches the detachable module from the main body. The detaching mechanism includes an engaging component and a driving component. The engaging component separately engages with the positioning component. The engaging component is movable relatively to the detachable module along a first direction. The driving component is movable relatively to the detachable module along a second direction different from the first direction. When the driving component moves along the second direction, the driving component moves the engaging component along the first direction, and the engaging component disengages from the positioning component.

According to an embodiment of the present invention, the detaching mechanism further includes an accommodating frame. The detachable module and the engaging component are disposed on the accommodating frame. The engaging component is movable along the first direction, and the driving component is disposed on the accommodating frame and movable along the second direction.

According to an embodiment of the present invention, a sliding portion is formed on the accommodating frame. A sliding slot is formed on the engaging component, and the sliding portion is disposed through the sliding slot and slidable relatively to the sliding slot along the first direction.

According to an embodiment of the present invention, a first through hole is formed on the sliding portion. An end of the driving component is disposed through the first through hole, and the driving component is movable relatively to the first through hole along the second direction.

According to an embodiment of the present invention, a protruding lug is further formed on the accommodating frame. The protruding lug is located correspondingly to the sliding portion. A second through hole is formed on the protruding lug. The second through hole is aligned with the first through hole along the second direction. Another end of the driving portion is disposed through the second through hole, and the driving component is movable relatively to the second through hole along the second direction.

According to an embodiment of the present invention, the detaching mechanism further includes a recovering component disposed between the accommodating frame and the engaging component.

According to an embodiment of the present invention, the detaching mechanism further includes an elastic component disposed between the accommodating frame and the driving component.

According to an embodiment of the present invention, a plurality of abutting portions are formed on the accommodating frame. The engaging component is clamped between the plurality of abutting portions, and a plurality of avoiding notches are formed on the engaging component.

According to an embodiment of the present invention, a restraining portion is formed on the accommodating frame. The restraining portion abuts against the detachable module.

In summary, in the present invention, when it is desired to detach the detachable module, a user only has to operate the driving component to move along the second direction, so as to push the engaging component to move along the first direction, so that the engaging component disengages from the positioning component for allowing the detachable module to be detached. In other words, during the aforementioned detachment process, the user does not have to use an additional tool, nor worry about any dropping element, such as a fastener in the prior art. Therefore, the present invention has advantages of simple structure and easy operation.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" or "couple" is intended to mean either an indirect or direct mechanical connection. Thus, if a first device is connected or coupled to a second device, that connection may be through a direct mechanical connection, or through an indirect mechanical connection via other devices and connections.

Figure 1:
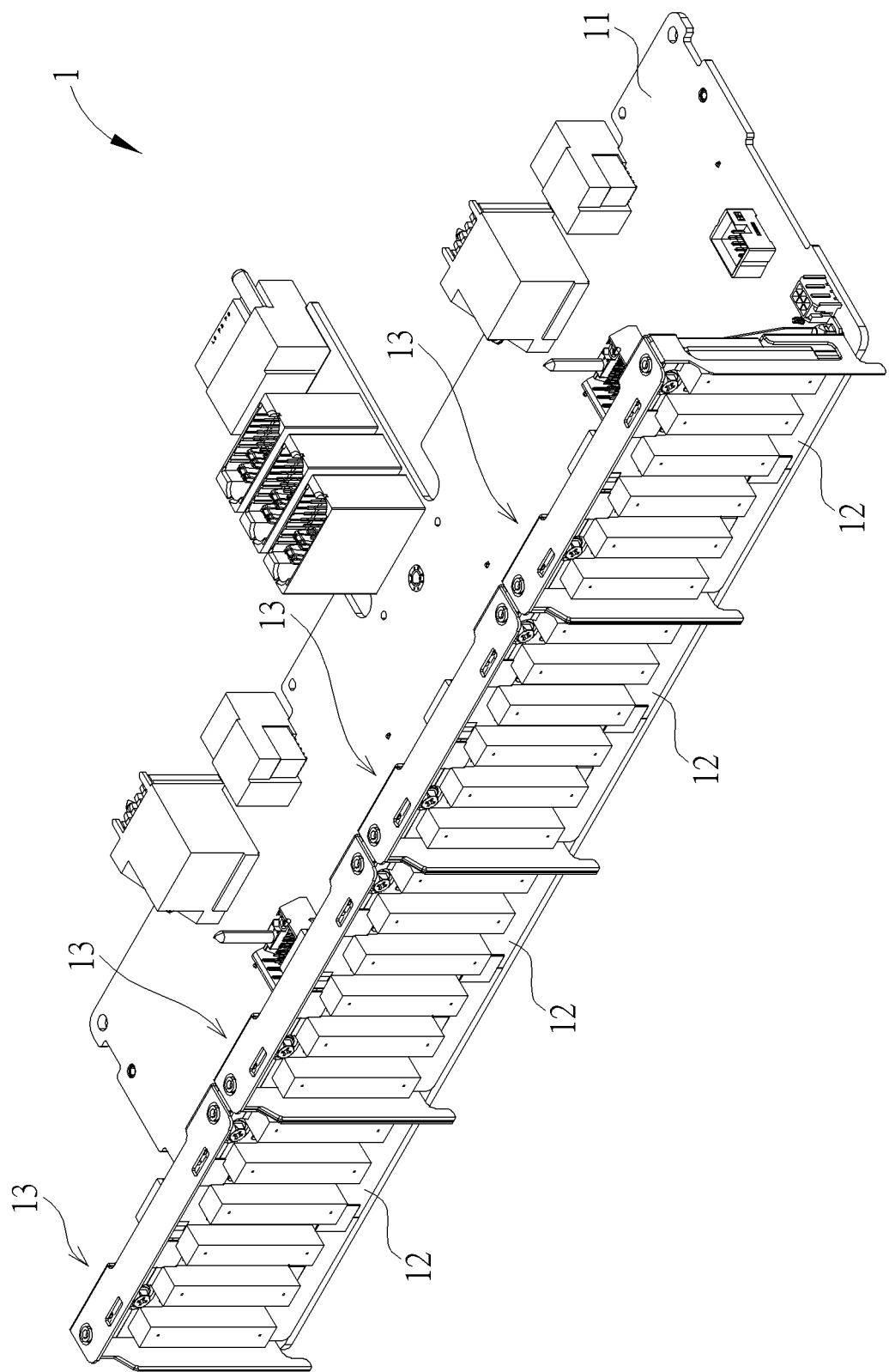
FIG. 1 and FIG. 2 are partial diagrams of an electronic device at different views according to an embodiment of the present invention.
Figure 2:
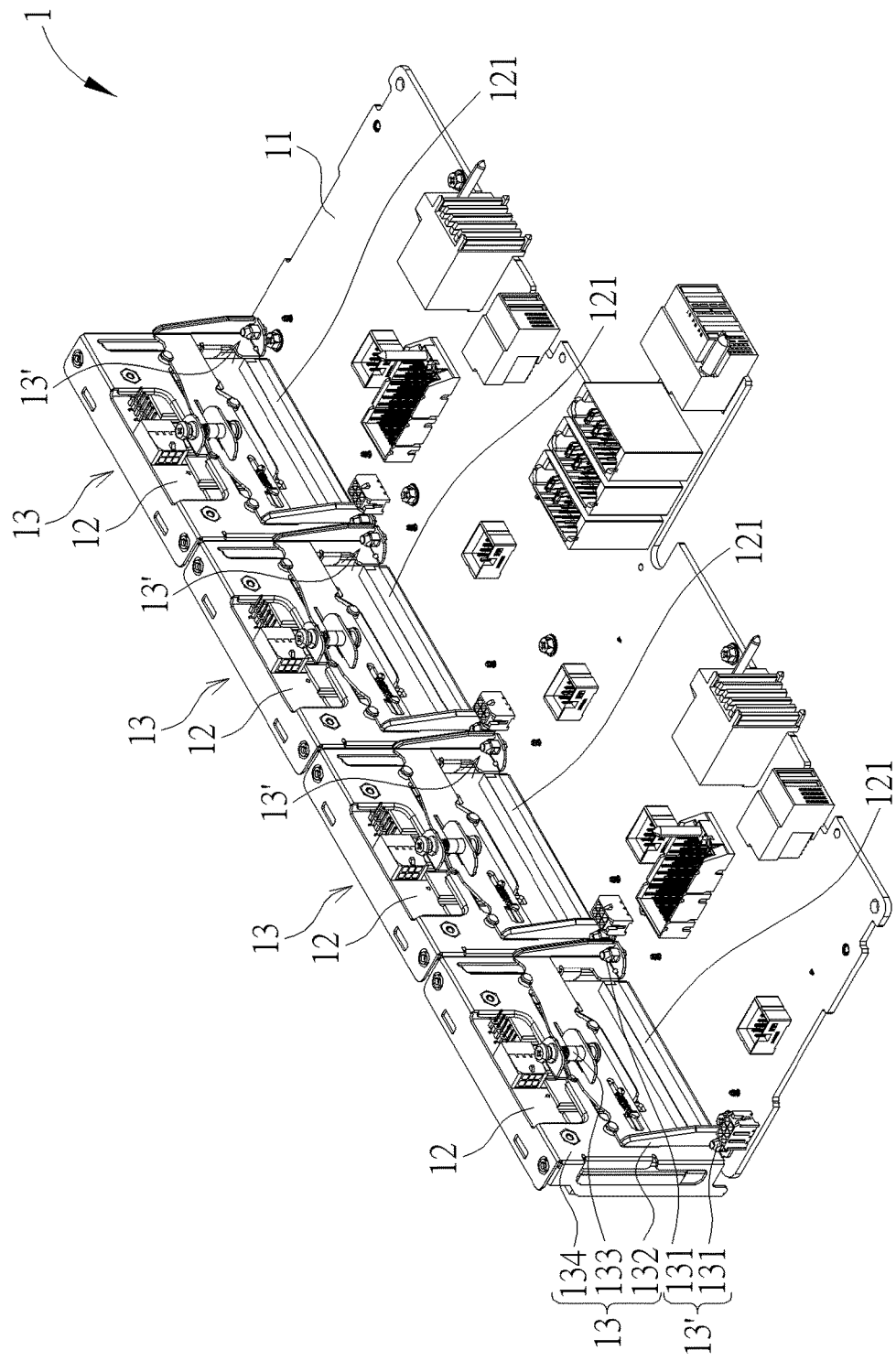
Figure 3:
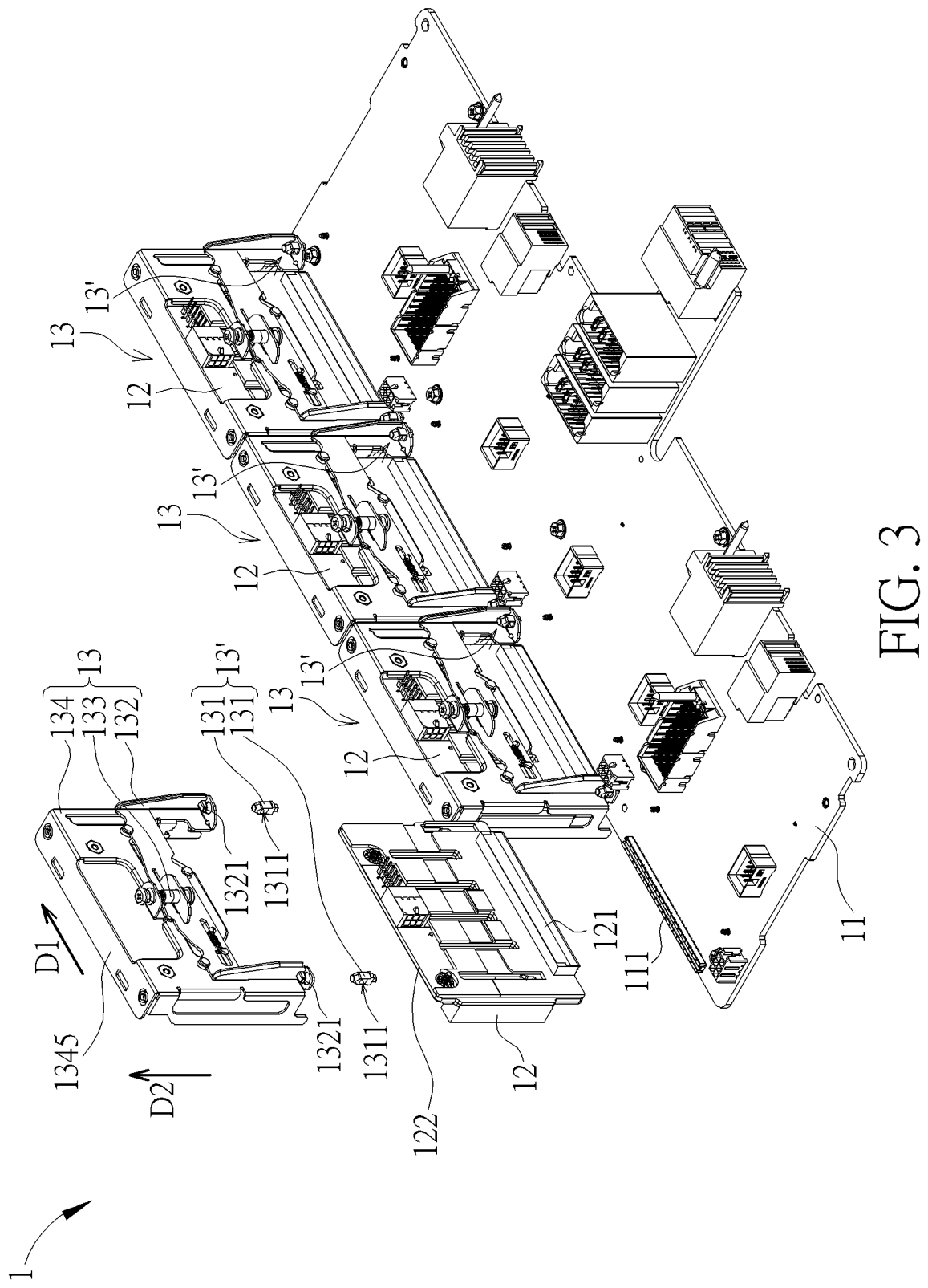
FIG. 3 and FIG. 4 are partial exploded diagrams of the electronic device at different views according to the embodiment of the present invention.
Figure 4:
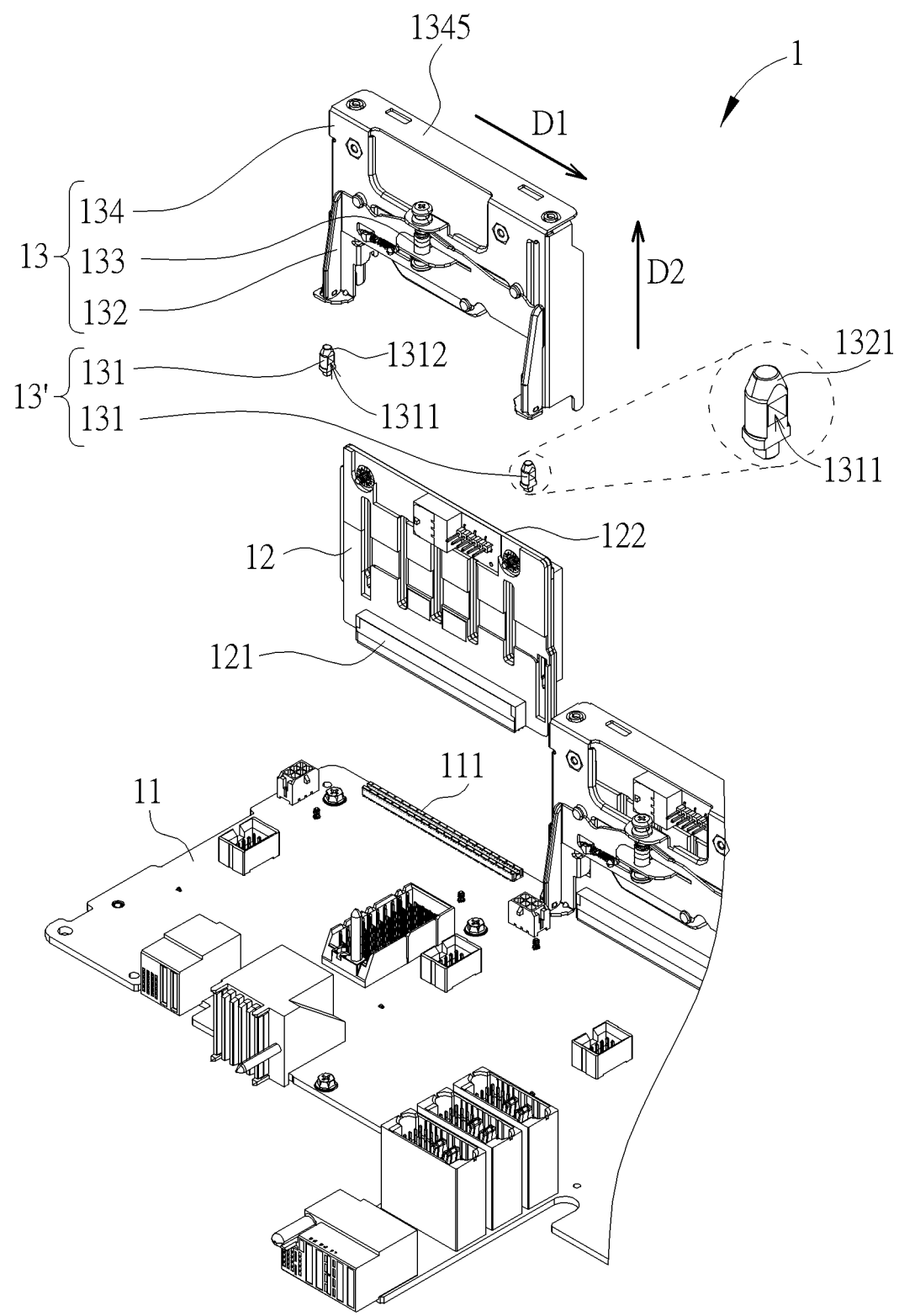

Please refer to FIG. 1 to FIG. 4. FIG. 1 and FIG. 2 are partial diagrams of an electronic device 1 at different views according to an embodiment of the present invention. FIG. 3 and FIG. 4 are partial exploded diagrams of the electronic device 1 at different views according to the embodiment of the present invention. As shown in FIG. 1 to FIG. 4, the electronic device 1 includes a main body 11, four detachable modules 12 and four detaching mechanisms 13. Each of the detachable modules 12 is detachably installed on the main body 11. Each of the detaching mechanisms 13 is configured to install the corresponding detachable module 12 on the main body 11 or detach the corresponding detachable 12 from the main body 11. Besides, the electronic device 1 further includes four positioning kits 13' located correspondingly to the four detachable modules 12 respectively. Each of the positioning kits 13' includes two positioning components 131 respectively located adjacent to two opposite sides of the corresponding detachable module 12.

In this embodiment, the electronic device 1 can be a server. The main body 11 can be a bridge circuit board fixedly disposed on a case of the server. The detachable module 12 can be a hard disk drive backplane module configured to be disposed on the main body 11 by insertion. An installation of the detachable module 12 relative to the main body 11 can be achieved by mating a first electrical connector 121 of the detachable module 12 with a second electrical connector 111 of the main body 11. A detachment of the detachable module 12 relative to the main body 11 can be achieved by separating the first electrical connector 121 of the detachable module 12 from the second electrical connector 111 of the main body 11. However, the present invention is not limited to this embodiment. For example, in another embodiment, the electronic device can be an industrial computer or a personal computer. The main body can be an installation lateral plate of a case of the industrial computer or the personal computer. The detachable module can be a fan module disposed on the installation lateral plate. The installation of the detachable module relative to the main body can be achieved by moving the detachable module to a predetermined position. The detachment of the detachable module relative to the main body can be achieved by moving the detachable module away from the predetermined position. In other words, the installation and the detachment of the detachable module relative to the main body can be irrelevant to a mating state of the first electrical connector of the detachable module and the second electrical connector of the main body.

Besides, the numbers of the detachable module and the detaching mechanism are not limited to this embodiment. For example, in another embodiment, the electronic device can only include one detachable module and one detaching mechanism.

Figure 5:
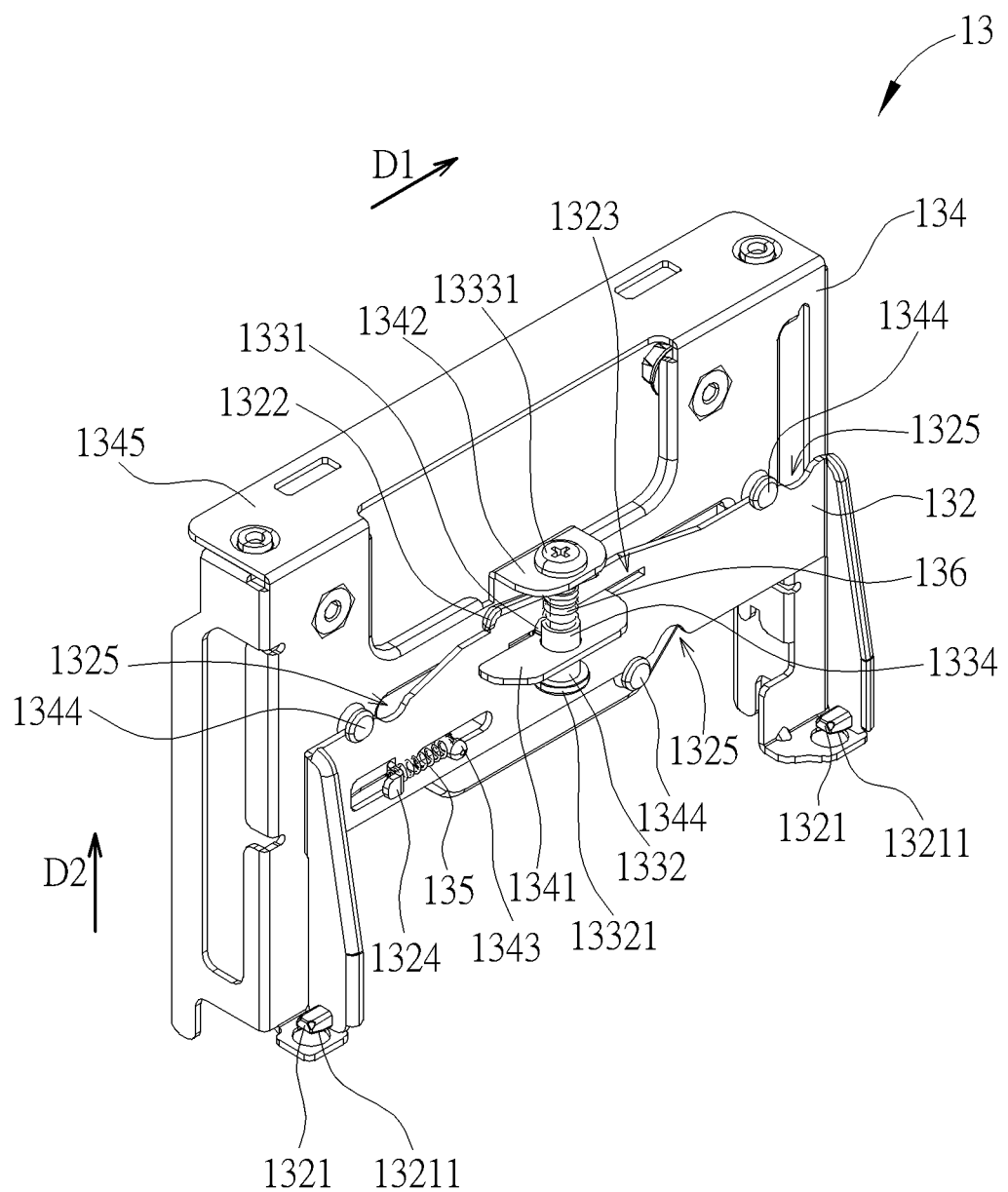
FIG. 5 is a partial diagram of a detaching mechanism according to the embodiment of the present invention.
Figure 6:
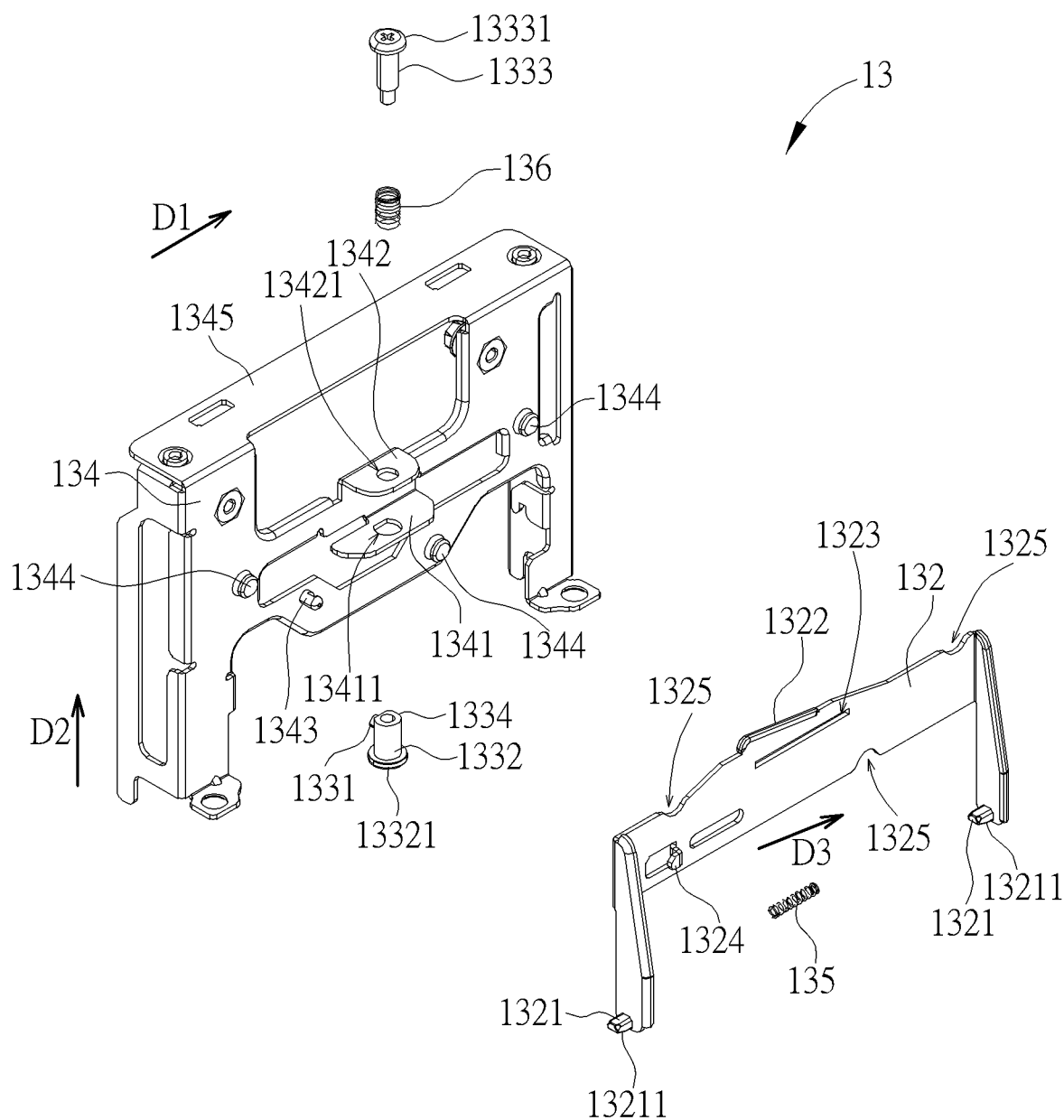
FIG. 6 and FIG. 7 are partial exploded diagrams of the detaching mechanism at different views according to the embodiment of the present invention.
Figure 7:
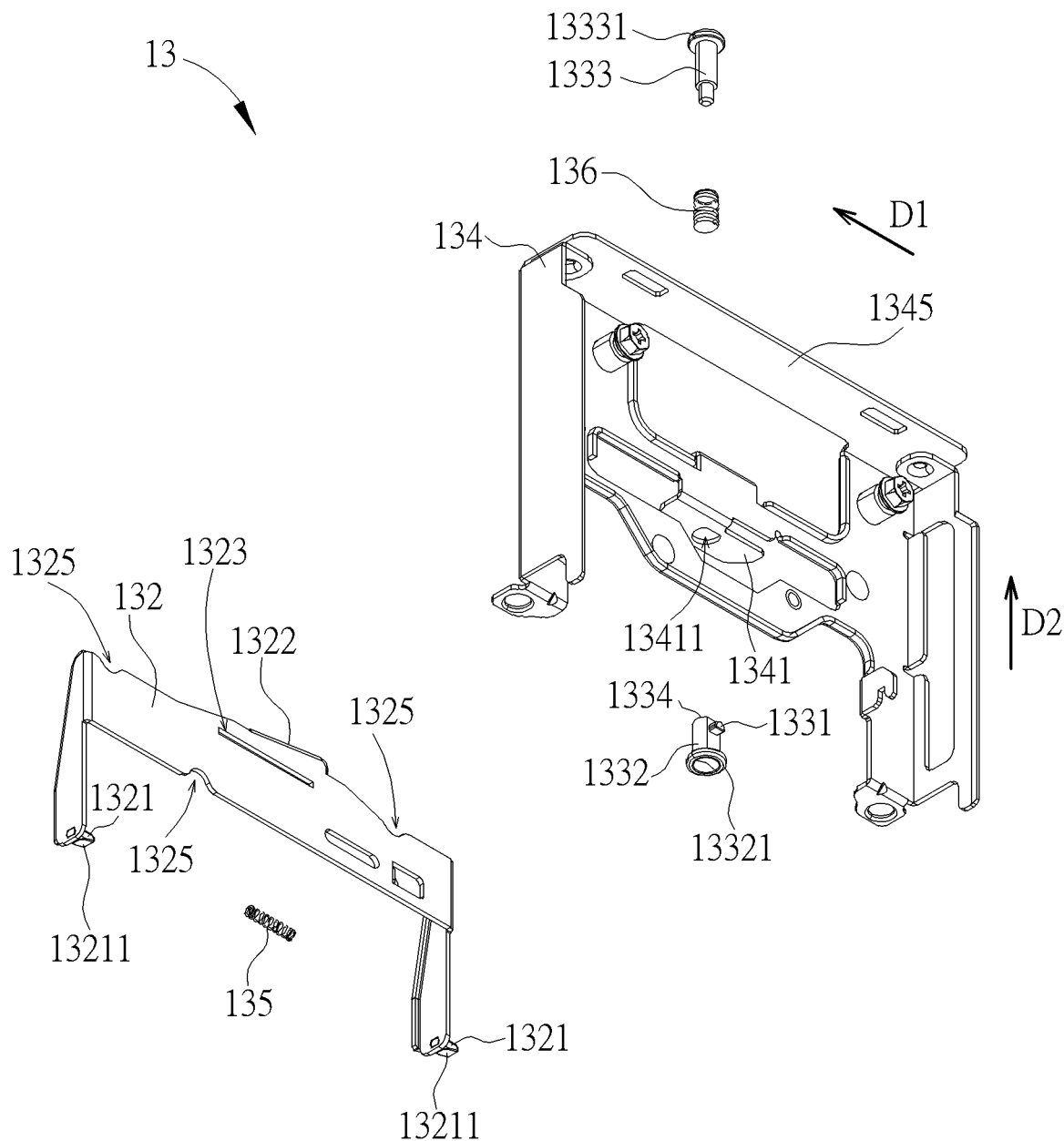

Please refer to FIG. 2 to FIG. 7. FIG. 5 is a partial diagram of the detaching mechanism 13 according to the embodiment of the present invention. FIG. 6 and FIG. 7 are partial exploded diagrams of the detaching mechanism 13 at different views according to the embodiment of the present invention. As shown in FIG. 2 to FIG. 7, each of the detaching mechanisms 13 includes an engaging component 132 and a driving component 133. The engaging component 132 is coupled to the corresponding detachable module 12 and movable relatively to the corresponding detachable module 12 along a first direction D1. The engaging component 132 is configured to separately engage with the two corresponding positioning components 131. The driving component 133 is coupled to the corresponding detachable module 12 and movable relatively to the corresponding detachable module 12 along a second direction D2 different from the first direction D1. When the driving component 133 moves along the second direction D2, the driving component 133 pushes the engaging component 132 to move along the first direction D1, so that the engaging component 132 disengages from the two corresponding positioning components 131, i.e., the engaging component 132 is separated from the two corresponding positioning components 131. Each of the detaching mechanisms 13 can restrain the corresponding detachable module 12 from being detached from the main body 11 by an engagement of the engaging component 132 and the two corresponding positioning components 131. Each of the detaching mechanisms 13 can allow the corresponding detachable module 12 to be detached from the main body 11 by a disengagement of the engaging component 132 and the two corresponding positioning components 131.

In this embodiment, the second direction D2 can be substantially identical to a detaching direction of the detachable module 12 relative to the main body 11 and substantially perpendicular to the first direction D1. However, the present invention is not limited to this embodiment. For example, in another embodiment, the second direction can be substantially identical to the detaching direction of the detachable module relative to the main body and substantially inclined relative to the first direction.

In order to achieve the engaging component 132 to engage with and disengage from the two positioning components 131, as shown in FIG. 3 to FIG. 7, a positioning portion 1311 is formed on each of the positioning components 131. Two engaging portions 1321 are formed on the engaging component 132. When the engaging component 132 moves along the first direction D1, each of the engaging portions 1321 departs away from the corresponding positioning portion 1311, so that the engaging component 132 disengages from the two positioning components 131. When the engaging component 132 moves along a direction opposite to the first direction D1, each of the engaging portions 1321 enters into the corresponding positioning portion 1311, so that the engaging component 132 engages with the two positioning components 131.

In this embodiment, the positioning component 131 can be a positioning column. The positioning portion 1311 can be a positioning hole formed on the positioning column. The engaging portion 1321 can be an engaging protrusion configured to cooperate with the positioning hole. However, the present invention is not limited to this embodiment. For example, in another embodiment, the positioning component can be a positioning block. The positioning portion can be a positioning protrusion protruding from the positioning block. The engaging portion can be an engaging recess configured to cooperate with the positioning protrusion.

Furthermore, the numbers and the configurations of the positioning component and the engaging portion are not limited to this embodiment. It depends on practical demands. For example, in another embodiment, the detaching mechanism can only include one positioning component adjacent to one side of the detachable module or a middle portion of the detachable module, and the engaging component can only include one engaging portion configured to cooperate with the positioning portion on the positioning component.

Besides, a guiding structure 1312 is formed on each of the positioning components 131. A guided structure 13211 is formed on each of the engaging portions 1321. When the engaging component 132 moves along a direction opposite to the second direction D2, each of the guiding structures 1312 can cooperate with the corresponding guided structure 13211 to push the engaging component 132 to move along the first direction D1 for preventing the engaging component 132 from being blocked by the positioning components 131.

In this embodiment, the guiding structure 1312 and the guided structure 13211 can be two inclined surfaces slidable relatively to each other. However, the present invention is not limited to this embodiment. For example, in another embodiment, the guiding structure and the guided structure can be two arc-shaped surfaces slidable relatively to each other.

In order to achieve the driving component 133 to push the engaging component 132 to move along the first direction D1 when the driving component 133 moves along the second direction D2, as shown in FIG. 5 to FIG. 7, the driving component 133 includes a pushing portion 1331. The engaging component 132 includes a pushed portion 1322. A longitudinal direction of the pushed portion 1322 is different from the first direction D1 and the second direction D2. Specifically, the longitudinal direction of the pushed portion 1322 can be parallel to a third direction D3 inclined relative the first direction D1 and the second direction D2. When the driving component 133 moves along the second direction D2, the driving component 133 pushes the engaging component 132 to move along the first direction D1 by a cooperation of the pushing portion 1331 and the pushed portion 1322.

In this embodiment, the pushed portion 1322 can be an inclined protruding rib extending along the third direction D3 and protruding along a first protruding direction perpendicular to the first direction D1, the second direction D2 and the third direction D3. The pushing portion 1331 can be a cooperating protrusion protruding along a second protruding direction opposite to the first protruding direction and configured to slidably abut against the inclined protruding rib. However, the present invention is not limited to this embodiment. For example, in another embodiment, the pushed portion can be an inclined sliding slot extending along the third direction different from the first direction and the second direction, and the pushing portion can be a cooperating pin slidably disposed through the inclined sliding slot.

As shown in FIG. 2 to FIG. 7, the engaging component 132 and the driving component 133 of each of the detaching mechanisms 13 are indirectly connected to the corresponding detachable module 12. In order to achieve the engaging component 132 and the driving component 133 to be indirectly connected to the detachable module 12, each of the detaching mechanisms 13 further includes an accommodating frame 134. The detachable module 12 is disposed on the accommodating frame 134. The engaging component 132 is disposed on the accommodating frame 134 and movable along the first direction D1. The driving component 133 is disposed on the accommodating frame 134 and movable along the second direction D2. In other words, the engaging component 132 and the driving component 133 are indirectly connected to the detachable module 12 by the accommodating frame 134.

In order to make the structure of the detaching mechanism 13 reasonable and compact, as shown in FIG. 5 to FIG. 7, a sliding portion 1341 is formed on the accommodating frame 134. A sliding slot 1323 is formed on the engaging component 132. The sliding portion 1341 is disposed through the sliding slot 1323 and slidable relatively to the sliding slot 1323 along the first direction D1. A first through hole 13411 is formed on the sliding portion 1341. A first end 1332 of the driving component 133 is disposed through the first through hole 13411. The driving component 133 is movable relatively to the first through hole 13411 along the second direction D2. A first flange 13321 is formed on the first end 1332 of the driving component 133 and configured to abut against the sliding portion 1341 for restraining a moving distance of the driving component 133 along the second direction D2.

Besides, a protruding lug 1342 is further formed on the accommodating frame 134. The protruding lug 1342 is located correspondingly to the sliding portion 1341. Specifically, the protruding lug 1342 is located above the sliding portion 1341. A second through hole 13421 is formed on the protruding lug 1342 and aligned with the first through hole 13411 along the second direction D2. A second end 1333 of the driving component 133 is disposed through the second through hole 13421. The driving component 133 is movable relatively to the second through hole 13421 along the second direction D2. A second flange 13331 is formed on the second end 1333 of the driving component 133 and configured to abut against the protruding lug 1342 for restraining a moving distance of the driving component 133 along the direction opposite to the second direction D2.

However, the present invention is not limited to this embodiment. For example, in another embodiment, there can be only the sliding portion formed on the accommodating frame, and the protruding lug can be omitted.

As shown in FIG. 3 to FIG. 7, each of the detaching mechanisms 13 further includes a recovering component 135 disposed between the accommodating frame 134 and the engaging component 132 and configured to drive the engaging component 132 to move along the direction opposite to the first direction D1 for engaging the engaging component 132 with the two positioning components 131.

In this embodiment, a connecting column 1343 protrudes from the accommodating frame 134 and is disposed through the engaging component 132. A connecting lug 1324 protrudes from the engaging component 132. The recovering component 135 can be an extension spring connected to the connecting column 1343 on the accommodating frame 134 and the connecting lug 1324 on the engaging component 132. However, the present invention is not limited to this embodiment. For example, in another embodiment, the recovering component can be a compression spring abutting against an abutting column on the accommodating frame and an abutting column on the engaging component. Alternatively, in another embodiment, the recovering component can be omitted.

Besides, as shown in FIG. 3 to FIG. 7, each of the detaching mechanisms 13 further includes an elastic component 136 disposed between the accommodating frame 134 and the driving component 133 and configured to drive the driving component 133 to move along the direction opposite to the second direction D2 for separating the pushing portion 1331 from the pushed portion 1322.

In this embodiment, a third flange 1334 is formed on a middle portion of the driving component 133 located between the protruding lug 1342 and the sliding portion 1341. The elastic component 136 can be a compression spring abutting against the protruding lug 1342 on the accommodating frame 134 and the third flange 1334 on the driving component 133. However, the present invention is not limited to this embodiment. For example, in another embodiment, the elastic component can be a compression spring abutting against the sliding portion on the accommodating frame and the first flange on the driving component. Alternatively, in another embodiment, the elastic component can be an extension spring abutting against the protruding lug on the accommodating frame and the second flange on the driving component. Alternatively, in another embodiment, the elastic component can be omitted.

Furthermore, as shown in FIG. 3 to FIG. 7, a plurality of abutting portions 1344 are formed on the accommodating frame 134. The engaging component 132 is clamped between the plurality of abutting portions 1344. A plurality of avoiding notches 1325 are formed on the engaging component 132. The plurality of abutting portions 1344 and the plurality of avoiding notches 1345 can cooperate with each other for allowing disposal of the engaging component 132 on the accommodating frame 134 easily. Besides, the plurality of abutting portions 1344 also can be configured to abut against the engaging component 132 for guiding the engaging component 132 to move relatively to the accommodating frame 134 along the first direction D1 and for preventing the engaging component 132 from being skewed during a movement of the engaging component 132. However, the present invention is not limited to this embodiment. For example, in another embodiment, the abutting portion and the avoiding notch can be omitted.

In addition, as shown in FIG. 4 to FIG. 7, a restraining portion 1345 is further formed on the accommodating frame 134 and configured to abut against the detachable module 12 for restraining the detachable module 12 from being detached or disengaged from the accommodating frame 134. Specifically, the restraining portion 1345 is configured to abut against an upper side 122 of the detachable module 12. In other words, the detachable module 12 cannot be detached independently. However, the present invention is not limited to this embodiment. For example, in another embodiment, the restraining portion can be omitted.

It should be noticed that the accommodating frame is not indispensable for achieving the present invention and can be omitted according to practical demands. For example, in another embodiment, the accommodating frame can be omitted, and there can be at least one plate-shaped portion protruding from a plate body of the detachable module and disposed through the sliding slot on the engaging component for allowing the driving component to pass therethrough, i.e., the engaging component and the driving component can be movably connected to the detachable module directly.

The elastic component can be disposed between the detachable module and the driving component. The recovering component can be disposed between the detachable module and the engaging component.

Figure 8:
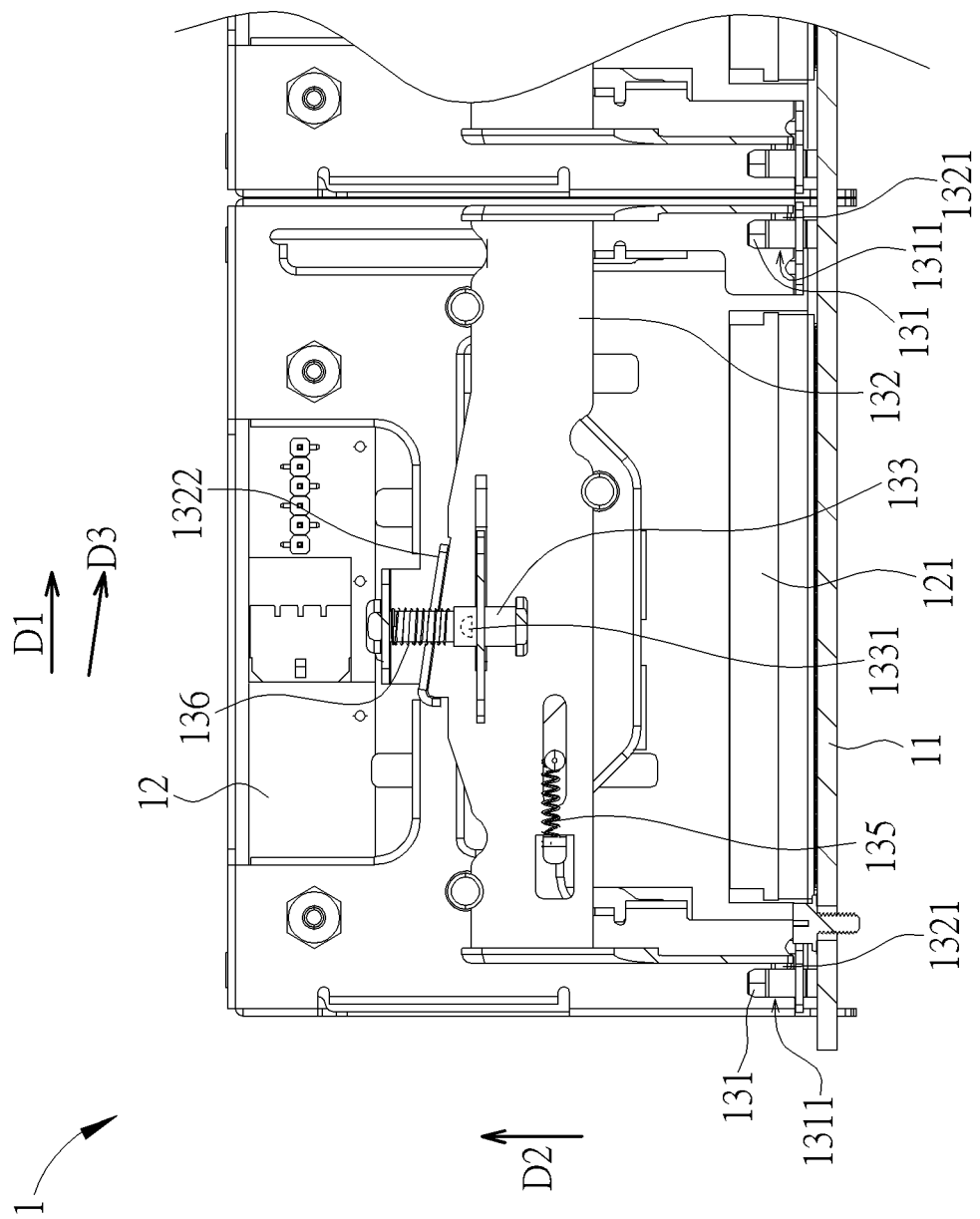
FIG. 8 to FIG. 10 are partial diagrams of the electronic device with the detaching mechanism in different states according to the embodiment of the present invention.
Figure 9:
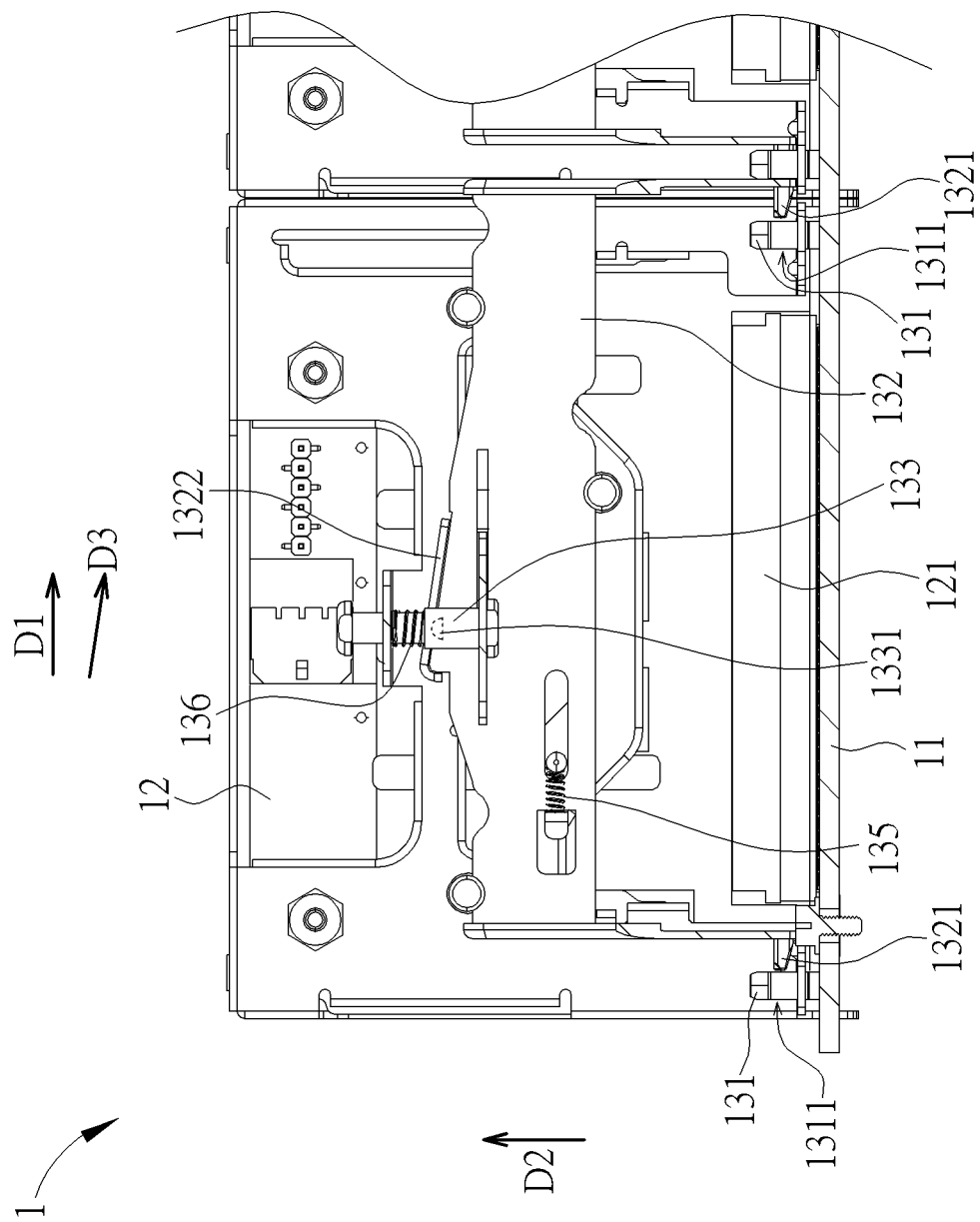
Figure 10:
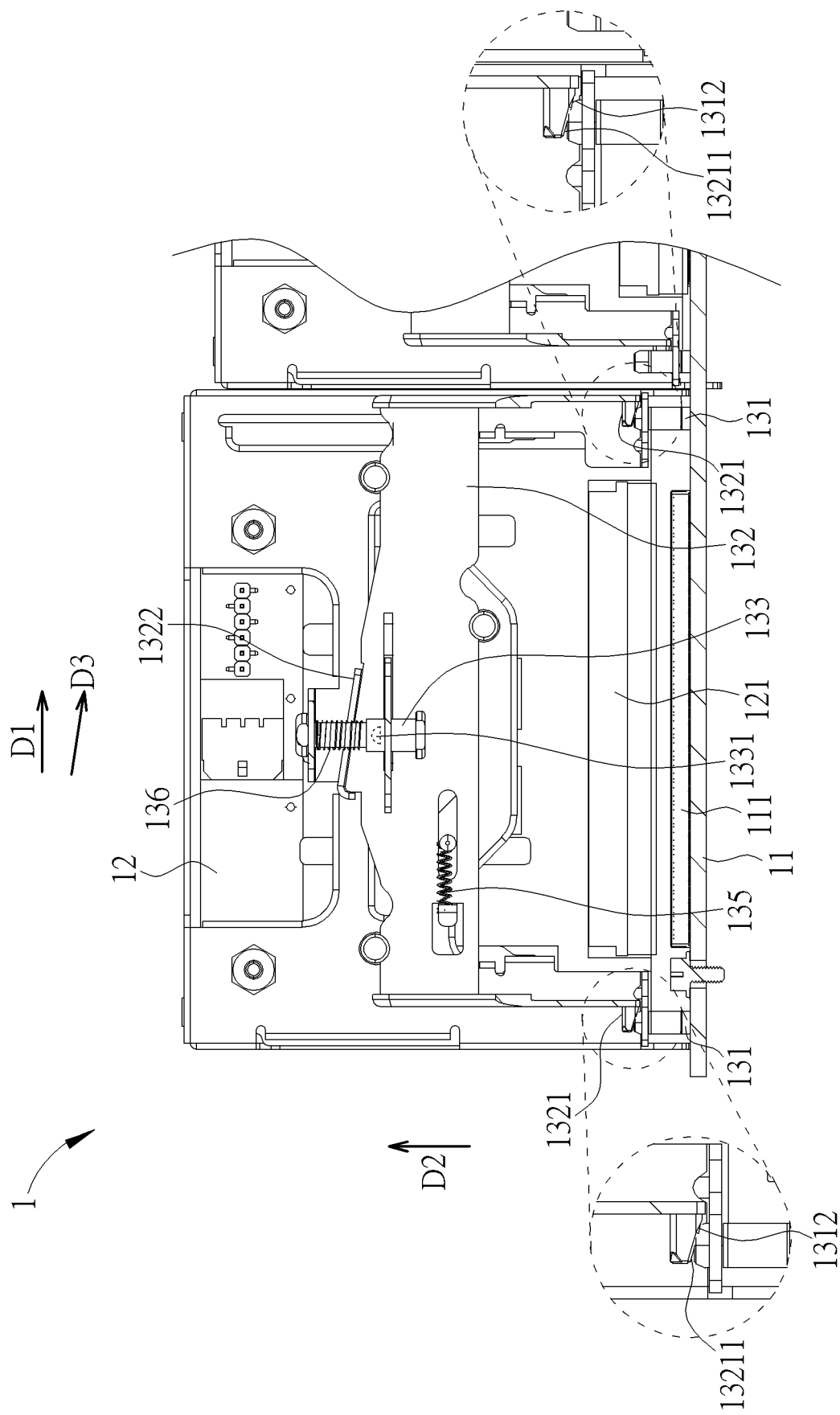

Please refer to FIG. 8 to FIG. 10. FIG. 8 to FIG. 10 are partial diagrams of the electronic device 1 with the detaching mechanism 13 in different states according to the embodiment of the present invention. Detailed description for the operational principle of the detaching mechanism 13 of the present invention is described as follows. When it is desired to detach the detachable module 12, the driving component 133 can be operated to move along the second direction D2 from a first operating position as shown in FIG. 8 to a second operating position as shown in FIG. 9. When the driving component 133 moves along the second direction D2 from the first operating position as shown in FIG. 8 to the second operating position as shown in FIG. 9, the driving component 133 pushes the engaging component 132 to move along the first direction D1 from a position as shown in FIG. 8 to a position as shown in FIG. 9 by the cooperation of the pushing portion 1331 and the pushed portion 1322, so that the engaging portions 1321 of the engaging component 132 depart from the positioning portions 1311 of the positioning components 131 for disengaging the engaging component 132 from the positioning components 131. At this moment, the recovering component 135 and the elastic component 136 are forced to resiliently deform by the engaging component 132 and the driving component 133 respectively. After the engaging component 132 disengages from the positioning components 131, the user can detach the detachable module 12 from the main body 11 along the second direction easily.

On the other hand, when it is desired to assemble the detachable module 12, the driving component 133 can be released to allow the elastic component 136 to drive the driving component 133 to move along the direction opposite to the second direction D2 for separating the pushing portion 1331 from the pushed portion 1322. Afterwards, the detachable module 12 can be operated to move along the direction opposite to the second direction D2, so as to move the engaging component 132 from a position as shown in FIG. 10 to the position as shown in FIG. 9 by a cooperation of the guiding structures 1312 and the guided structures 13211. When the engaging component 132 reaches the position as shown in FIG. 9, the engaging portions 1321 of the engaging component 132 are aligned with the positioning portions 1311 of the positioning components 131 respectively. At this moment, the recovering component 135 can drive the engaging component 132 to move along the direction opposite to the first direction D1 to move the engaging portions 1321 of the engaging component 132 into the positioning portions 1311 of the positioning components 131 respectively, so as to engage the engaging component 132 with the positioning components 131 for restraining the detachable module 12 from being detached from the main body 11, which achieves installation and positioning of the detachable module 12.

In contrast to the prior art, in the present invention, when it is desired to detach the detachable module, a user only has to operate the driving component to move along the second direction, so as to push the engaging component to move along the first direction, so that the engaging component disengages from the positioning component for allowing the detachable module to be detached. In other words, during the aforementioned detachment process, the user does not have to use an additional tool, nor worry about any dropping element, such as a fastener in the prior art. Therefore, the present invention has advantages of simple structure and easy operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detaching mechanism for a detachable module, the detaching mechanism comprising:
   an engaging component separately engaging with a positioning component, the engaging component being movable relatively to the detachable module along a first direction; and
   a driving component movable relatively to the detachable module along a second direction perpendicular to the first direction, wherein when the driving component moves along the second direction, the driving component moves the engaging component along the first direction, and the engaging component disengages from the positioning component.

2. The detaching mechanism of claim 1, further comprising an accommodating frame, the detachable module and the engaging component being disposed on the accommodating frame, the engaging component being movable along the first direction, and the driving component being disposed on the accommodating frame and movable along the second direction.

3. The detaching mechanism of claim 2, wherein a sliding portion is formed on the accommodating frame, a sliding slot is formed on the engaging component, and the sliding portion is disposed through the sliding slot and slidable relatively to the sliding slot along the first direction.

4. The detaching mechanism of claim 3, wherein a first through hole is formed on the sliding portion, an end of the driving component is disposed through the first through hole, and the driving component is movable relatively to the first through hole along the second direction.

5. The detaching mechanism of claim 4, wherein a protruding lug is further formed on the accommodating frame, the protruding lug is located correspondingly to the sliding portion, a second through hole is formed on the protruding lug, the second through hole is aligned with the first through hole along the second direction, another end of the driving portion is disposed through the second through hole, and the driving component is movable relatively to the second through hole along the second direction.

6. The detaching mechanism of claim 2, further comprising a recovering component disposed between the accommodating frame and the engaging component.

7. The detaching mechanism of claim 2, further comprising an elastic component disposed between the accommodating frame and the driving component.

8. The detaching mechanism of claim 2, wherein a plurality of abutting portions are formed on the accommodating frame, the engaging component is clamped between the plurality of abutting portions, and a plurality of avoiding notches are formed on the engaging component.

9. The detaching mechanism of claim 2, wherein a restraining portion is formed on the accommodating frame, the restraining portion abuts against the detachable module.

10. The detaching mechanism of claim 1, wherein a positioning portion is formed on the positioning component, an engaging portion is formed on the engaging component, when the engaging component moves along the first direction, the engaging portion departs away from the positioning portion, and the engaging component disengages from the positioning component.

11. The detaching mechanism of claim 1, wherein the driving component comprises a pushing portion, the engaging component comprises a pushed portion, a longitudinal direction of the pushed portion is different from the first direction and the second direction, when the driving component moves along the second direction, the driving component pushes the engaging component to move along the first direction by a cooperation of the pushing portion and the pushed portion.

12. An electronic device comprising:
   a main body;
   a positioning component fixedly disposed on the main body;
   a detachable module detachably installed on the main body; and
   a detaching mechanism installing the detachable module on the main body or detaching the detachable module from the main body, the detaching mechanism comprising:
      an engaging component separately engaging with the positioning component, the engaging component being movable relatively to the detachable module along a first direction; and
      a driving component movable relatively to the detachable module along a second direction perpendicular to the first direction, wherein when the driving component moves along the second direction, the driving component moves the engaging component along the first direction, and the engaging component disengages from the positioning component.

13. The electronic device of claim 12, wherein the detaching mechanism further comprises an accommodating frame, the detachable module and the engaging component are disposed on the accommodating frame, the engaging component is movable along the first direction, and the driving component is disposed on the accommodating frame and movable along the second direction.

14. The electronic device of claim 13, wherein a sliding portion is formed on the accommodating frame, a sliding slot is formed on the engaging component, and the sliding portion is disposed through the sliding slot and slidable relatively to the sliding slot along the first direction.

15. The electronic device of claim 14, wherein a first through hole is formed on the sliding portion, an end of the driving component is disposed through the first through hole, and the driving component is movable relatively to the first through hole along the second direction.

16. The electronic device of claim 15, wherein a protruding lug is further formed on the accommodating frame, the protruding lug is located correspondingly to the sliding portion, a second through hole is formed on the protruding lug, the second through hole is aligned with the first through hole along the second direction, another end of the driving portion is disposed through the second through hole, and the driving component is movable relatively to the second through hole along the second direction.

17. The electronic device of claim 13, wherein the detaching mechanism further comprises a recovering component disposed between the accommodating frame and the engaging component.

18. The electronic device of claim 13, wherein the detaching mechanism further comprises an elastic component disposed between the accommodating frame and the driving component.

19. The electronic device of claim 13, wherein a plurality of abutting portions are formed on the accommodating frame, the engaging component is clamped between the plurality of abutting portions, and a plurality of avoiding notches are formed on the engaging component.

20. The electronic device of claim 12, wherein a restraining portion is formed on the accommodating frame, the restraining portion abuts against the detachable module.

* * * * *